United States Patent [19]
Katampe et al.

[11] Patent Number: 6,127,084
[45] Date of Patent: Oct. 3, 2000

[54] PHOTOSENSITIVE MATERIAL EMPLOYING MICROCAPSULES CONTAINING A HYGROSCOPIC POLYMER IN THE INTERNAL PHASE

[75] Inventors: Ibrahim Katampe, Dayton; Joseph C. Camillus, Centerville, both of Ohio

[73] Assignee: Cycolor, Inc., Miamisburg, Ohio

[21] Appl. No.: 09/177,743

[22] Filed: Oct. 23, 1998

[51] Int. Cl.⁷ .............................. G03C 1/765; G03C 8/12; G03C 8/44; G03F 7/105; G03F 7/11
[52] U.S. Cl. .................... 430/138; 430/207; 430/211; 430/496
[58] Field of Search .................................. 430/138, 207, 430/211, 496

[56] References Cited

U.S. PATENT DOCUMENTS

| | | | |
|---|---|---|---|
| 2,730,456 | 1/1956 | Green et al. | 117/36 |
| 2,800,457 | 7/1957 | Green et al. | 252/316 |
| 3,672,935 | 6/1972 | Miller et al. | 117/36.8 |
| 3,732,120 | 5/1973 | Brockett et al. | 117/16 |
| 3,755,190 | 8/1973 | Hart et al. | 252/316 |
| 3,796,669 | 3/1974 | Kiritani et al. | 252/316 |
| 3,914,511 | 10/1975 | Vassiliades | 428/411 |
| 3,920,510 | 11/1975 | Hatano et al. | 162/162 |
| 4,001,140 | 1/1977 | Foris et al. | 252/316 |
| 4,025,455 | 5/1977 | Shackle | 252/316 |
| 4,087,376 | 5/1978 | Foris et al. | 252/316 |
| 4,089,802 | 5/1978 | Foris et al. | 252/316 |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,501,809 | 2/1985 | Hiraishi et al. | 430/138 |
| 4,766,050 | 8/1988 | Jerry | 430/138 |
| 4,772,530 | 9/1988 | Gottschalk et al. | 430/138 |
| 4,772,541 | 9/1988 | Gottschalk et al. | 430/339 |
| 4,800,149 | 1/1989 | Gottschalk et al. | 430/138 |
| 4,842,980 | 6/1989 | Gottschalk et al. | 430/138 |
| 4,865,942 | 9/1989 | Gottschalk et al. | 430/138 |
| 4,912,011 | 3/1990 | Yamamoto et al. | 430/138 |
| 5,057,393 | 10/1991 | Shanklin et al. | 430/138 |
| 5,071,823 | 12/1991 | Matsushita et al. | 430/138 |
| 5,091,280 | 2/1992 | Yamaguchi et al. | 430/138 |
| 5,100,755 | 3/1992 | Shanklin | 430/138 |
| 5,112,752 | 5/1992 | Johnson et al. | 435/192 |
| 5,230,982 | 7/1993 | Davis et al. | 430/138 |
| 5,516,621 | 5/1996 | Tsuda et al. | 430/138 |
| 5,783,353 | 7/1998 | Camillus et al. | 430/138 |
| 5,955,237 | 9/1999 | Hattori et al. | 430/138 |

FOREIGN PATENT DOCUMENTS

| | | |
|---|---|---|
| 02096162 | 4/1990 | Japan. |
| 10301269 | 11/1998 | Japan. |
| WO 95/34845 | 12/1995 | WIPO. |
| WO 99/46642 | 9/1999 | WIPO. |

OTHER PUBLICATIONS

PCT Search Report for foreign counterpart, PCT/US99/14580 filed Jun. 24, 1999.

*Primary Examiner*—Richard L. Schilling
*Attorney, Agent, or Firm*—Thompson Hine & Flory LLP

[57] ABSTRACT

A photosensitive material including a support having a layer of photosensitive microcapsules on the surface thereof, the photosensitive microcapsules including an internal phase containing a photosensitive composition and a color precursor wherein, upon image-wise exposing the photosensitive material and rupturing the microcapsules, the color precursor is image-wise released from the microcapsules to form a color image, the photosensitive material further including a hygroscopic polymer, is disclosed.

13 Claims, No Drawings

PHOTOSENSITIVE MATERIAL EMPLOYING MICROCAPSULES CONTAINING A HYGROSCOPIC POLYMER IN THE INTERNAL PHASE

BACKGROUND OF THE INVENTION

The present invention relates to an improvement in photosensitive imaging systems of the type taught in U.S. Pat. Nos. 4,399,209 and 4,440,846, wherein a hygroscopic polymer is incorporated in the internal phase of a microencapulated photosensitive material or in a coating composition containing photosensitive microcapsules. It is believed that the hygroscopic polymer prevents the microcapsules from drying out upon storage.

Photohardenable imaging systems employing microencapsulated radiation sensitive compositions are the subject of commonly assigned U.S. Pat. Nos. 4,399,209; 4,416,966; 4,440,846 and 4,766,050. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers. An image transfer system in which the developer material is coated on a separate substrate as a separate developer or copy sheet is disclosed in commonly assigned U.S. Pat. No. 4,399,209. A self-contained imaging sheet in which the encapsulated color former and the developer material are co-deposited on one surface of a single substrate as one layer or as two interactive layers is disclosed in commonly assigned U.S. Pat. No. 4,440,846. An imaging system comprising a support, a layer containing microcapsules, a layer of developer material, and a layer containing an opacifying agent is disclosed in commonly assigned U.S. Pat. No. 4,766,050. The opacifying agent can form a separate layer or can be part of the layer containing the microcapsules or both but is interposed between the microcapsules and the developer to hide the microcapsules when viewing the image.

When imaging systems, particularly the self-contained imaging systems of the type described in U.S. Pat. No. 4,440,846 and recently allowed copending U.S. application Ser. No. 08/570,658 filed Dec. 11, 1995, now U.S. Pat. No. 5,783,353 are exposed and developed after having been stored for a period of time, the images have a tendency to darken over time. This darkening has been attributed to the presence of undeveloped color precursor outside the capsule which gradually reacts with the developer material and causes the image to darken.

Accordingly, it is desirable to provide an imaging system wherein this undesirable tendency to darken over time is reduced or eliminated.

SUMMARY OF THE INVENTION

Experimental studies have shown that if imaging media employing photosensitive microcapsules is stored under relatively high humidity, the amount of undeveloped color precursor that is observed outside the capsules after exposure and development is significantly less and the tendency for the image to darken is reduced or eliminated. This observation led to the hypothesis that upon storage under less humid conditions, the capsules are releasing more of their contents when they are ruptured and that the capsules themselves may be drying out and becoming more brittle and more readily rupturable upon storage. A dry capsule is brittle and releases more color precursor when it ruptures, whereas a softer, less dry capsule, tends to retain more color precursor after it ruptures making less undeveloped color precursor available to darken the image.

In accordance with the invention, a hygroscopic polymer is incorporated into the internal phase of the microcapsules in an imaging system to prevent or reduce the tendency of the image to darken. While not desiring to be bound, it is believed that the hygroscopic polymer prevents the microcapsule from drying out upon storage.

It has been found that when a hygroscopic polymer of the type disclosed herein is incorporated in an imaging material in the manner described herein, improvements in $D_{min}$, color brightness, image stability and shelf life may be observed.

DETAILED DESCRIPTION OF THE INVENTION

U.S. Pat. Nos. 4,399,209 and 4,440,846 and pending application Ser. No. 08/570,658 filed Dec. 11, 1995 are incorporated herein by reference.

The improved imaging system of the invention may be embodied in a self-contained copy sheet in which the encapsulated chromogenic material and the developer material are co-deposited on one surface of a single substrate as one layer or as two interactive layers or they are deposited on two supports in layers which can interact when the supports are juxtaposed; or it may be embodied in a transfer system in which the developer material is coated on a separate substrate as a separate developer or copy sheet. Both systems operate by photographic control of the access between the chromogenic material and the developer as previously described. In the self-contained imaging system, following capsule rupture, the chromogenic material and the developer are able to react to form a visible image in the exposed or the unexposed areas (depending on whether the photosensitive composition is photohardened or photosoftened). Gradual development of the visible image is observed following exposure and capsule rupture as the chromogenic material and developer migrate, mix and react on the face of the sheet.

Typically, capsule rupture is effected by the application of pressure to the imaging sheet alone (in the case of a self-contained system) or in contact with a developer sheet (in a transfer system using pressure rollers or a roller ball). Alternative means of capsule rupture can also be used. For example, systems, are envisioned in which the capsules are ruptured ultrasonically, thermally, or by solvent.

In one embodiment of the invention, a hygroscopic polymer is incorporated into the internal phase of the microcapsules which contain a chromogenic material and a photosensitive composition. The hygroscopic polymer is dissolved in the internal phase constituents prior to encapsulation. In order to be dissolved in the internal phase, the hygroscopic polymer should be soluble in the internal phase constituents such as the acrylate esters described below. Hydroxy-containing polyacrylates are particularly desirable for use in the invention because they are compatible with the acrylate monomers preferably used in the internal phase. The hygroscopic polymer can be added to the internal phase in an amount of about 0.05 to 2.5% and more typically about 0.05 to 1.5% based on the monomer.

In another embodiment of the invention, the hygroscopic polymer is added to the microcapsule coating composition.

The hygroscopic polymer can be dissolved or dispersed in the continuous phase during encapsulation such that it becomes part of the coating composition when the microcapsules are collected and blended with binders such as polyvinyl alcohol to form the coating composition. Alternatively, the hygroscopic polymer is added to the microcapsule coating composition after the microcapsules are recovered in the encapsulation process. Also, when the hygroscopic polymer is added to the internal phase, some of the polymer may move into the continuous phase and become part of the microcapsule coating composition. The amount of hygroscopic polymer added to the coating composition will vary with the nature of the hygroscopic polymer and the nature and amount of the other resins used in the composition. The amount should be limited to an amount that does not interfere with capsule rupture and reaction of the color former with the developer such that $D_{max}$ is reduced. The hygroscopic polymer is preferably incorporated in the coating composition in an amount of about 1 to 10% based on resin solids used in the composition and more typically in an amount of 1 to 5%.

The hygroscopic polymer useful in the present invention are those polymers capable of absorbing large quantities of water or moisture. Representative examples of such hygroscopic polymers include hydroxy-containing polymers such as partially hydrolzyed polyesters, e.g., partially hydrolzyed acrylate or methacrylate polymers or copolymers, sulfonated polyesters of aromatic dicarboxylic acids and aliphatic or cycloaliphatic glycols including alkali metal derivatives thereof, polyvinyl alcohol, polyvinylpyrrolidone, polyvinyl imidazol, polyacrylamides, polymethacrylamides, polystyrenesulfonic acid, corn and wheat starch, agar, xanthan gums, gelatin, gelatin derivatives such as phthalated gelatins, cellulose such as hydroxy cellulose, carboxymethyl cellulose and the like, and soluble starches such as dextrin. One class of hygroscopic polymers particularly useful in the invention is hydroxy-containing polymers such as partially hydrolyzed polyesters. A specific material of this type is the AQ polymers from Eastman Chemical and, more particularly, AQ38 and AQ55. These polymers are sulfonated polyesters of aromatic dicarboxylic acids and aliphatic or cycloaliphatic glycols and more particularly alkali metal salts thereof such as sodium salts. It has been found that the AQ polymers from Eastman Chemical Co. are particularly preferred.

The operational center of the imaging system of the present invention is the encapsulate or internal phase of the coating composition and optionally a chromogenic material. In accordance with the invention, the internal phase comprises a photosensitive composition. Typically, the photosensitive composition includes a photoinitiator and a substance which undergoes a change in viscosity upon exposure to light in the presence of the photoinitiator. That substance may be a monomer, dimer, or oligomer which is polymerized to a higher molecular weight compound or it may be a polymer which is cross-linked. Alternatively it may be a compound which is depolymerized or otherwise decomposed upon exposure.

Typically, the substance which undergoes a change in viscosity is a free radical addition polymerizable or crosslinkable compound. The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethylene glycol dimethacrylate.

Another radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483. Another class of curable materials useful in the present invention are found in radiation curable inks as the photosensitive component such as a mixture of a pentaerythritol acrylate and halogenated aromatic, alicyclic or aliphatic photoinitiator as disclosed in U.S. Pat. No. 3,661,614 to Bessemir et al, which is also incorporated by reference. Another type radiation curable material is halogenated resins which can be cross-linked up exposure, to ultraviolet radiation.

Some typical examples of radiation de-polymerizable materials useful in other embodiments of the invention are 3-oximino-2-butanone methacrylate which undergoes main chain scission upon ultraviolet exposure and poly (4'-alkyl acylo-phenones. See Reichmanis, E.; *Am. Chem. Soc. Div. Org. Coat. Plast. Chem. Prepr.* 1980, 43, 243–251 and Lukac, I.; Chmela S., Int. Conf. on Modif. Polym. 5th Bratislava, Czech, July 3–6, I.U.P.A.C. Oxford, England, 1979, 1, 176–182.

The radiation curable or depolymerizable material usually makes up the majority of the internal phase. A radiation curable material must be present in an amount sufficient to immobilize the chromogenic material upon exposure. With a depolymerizable material, on the other hand, the internal phase must be constituted such that the chromogenic material is immobilized prior to exposure but is released after exposure and capsule rupture. Typically these materials constitute 40 to 99 wt % of the internal phase (based on the weight of the oil solution containing the chromogen, the photosensitive composition and the carrier oil when present). In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

The chromogenic materials used in the present invention are those chromogenic materials conventionally used in carbonless paper. In general, these materials are colorless electron donating type dry precursor compounds which react with a developer compound to generate a dye. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl) phthalide, 3-(p-dimethylaminophenyl)-3-(1,2-dimethylindole-3-yl)phthalide, 3-(p-dimethylaminophenyl)-3-(2-methylindole-3-yl)phthalide,3-(pdimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl)-6-dimethylaminophthalide, 3,3-bis(9-ethylcarbazole-3-yl)-5-dimethylaminophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine(p-nitroanilino) lactam, Rhodamine-B-(p-chloroanilino)lactam, 3-dimethylamino-6methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, 3-methyl-spiro-dinaphthopyran, 3,3'-dichloro-spiro-dinaphthopyran, 3-benzyl-spirodinaphthopyran, 3-methyl-naphtho-(3-methoxybenzo)-spiropyran, 3-propylspirodibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates or salts can be adapted for use in the present invention.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer. One means of preventing undesired coloration in a self-contained sheet is to reduce the amount of the chromogenic material in the internal phase. Another means is to incorporate color suppressants with the chromogenic material.

In addition to the chromogenic material, the photosensitive material, and the hygroscopic polymer, the internal phase of the present invention may also include a carrier oil to affect and control the tonal quality of the images obtained. While tonal quality (half-tone gradation) is not critical when copying printed documents, it is an important factor in faithfully reproducing pictorial images. Initial studies show that where trimethylol propane triacrylate is used in the radiation curable material, 20% of a carrier oil such as brominated paraffin improves tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, caster oil, mineral oil, deodorized kerosense, naphthenic mineral oils, dibutyl phthalate, dibutyl fumerate, brominated paraffin and mixtures thereof. Alkylated biphenyls are generally less toxic and preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulforyl thioxanthanone, chloromethylnaphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, a chloromethyl quinoline, a chlorosulfonyl quinoline, a chloromethyl benzophenone, a chlorosulfonyl benzophenone, a chloromethyl fluorenone, a chlorosulfony fluorenone, carbon tetrabromide, benzoin methyl ether, benzoin ethyl ether, desyl chloride, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

The photoinitiator is present in the internal phase in an amount sufficient to initiate polymerization or cross-linking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition.

Particularly useful as photoinitiators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. When employed as a photoinitiator in the present invention, the cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight. While the cationic dye-borate anion complex can be used alone as the initiator, film speeds tend to be quite low and oxygen inhibition is observed. It has been found that it is preferable to use the complex in combination with an autoxidizer. An autoxidizer is a compound which is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N, Ndimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N, N-dimethylaniline, 4-methyl-N,N-dimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N',N'-tetramethyl-1, 4-dianiline, 4-acetamido-N, N-dimethylaniline, 2,6-diisopropyl-N,N-dimethylaniline (DIDMA), 2,6-diethyl-N, N-dimethylaniline, N,N,2,4,6-pentamethylaniline (PMA) and p-t-butyl-N,N-dimethylaniline. In accordance with one aspect of the invention, the photohardenable compositions used in the microcapsules contain a dye borate photoinitiator and a disulfide coinitiator. Examples of useful disulfides are described in U.S. Pat. No. 5,230,982.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(α-methylbenzyl) salicylate, oil soluble metals salts or phenol-formaldehyde novolak resins (e.g., see U.S. Pat. Nos. 3,672, 935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

A preferred developer material is one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall (or both). The microcapsules may become completely disrupted with a complete breakdown or disintegration of the wall. The problem is believed to be caused by the presence of water soluble acid salts in the developer solution. By modifying the acidic salts to make them water insoluble the developer material becomes compatible with the MF microcapsules. A preferred developer, which has good stability is Schenectady International resin HRJ-4250 solution.

One suitable method for encapsulating the internal phase is to disperse a water-immiscible solution of the internal phase constituents in a water miscible solution of the capsule wall forming material and to induce phase separation. In one embodiment of the invention, the internal phase is encapsulated in a urea-formaldehyde wall-former and, more particularly, a urea-resorcinol-formaldehyde wall former in which resorcinol has been added to the wall former to enhance its oleophilicity. Other hydrophilic wall-forming materials which may also be useful in the present invention include gelatin (see U.S. Pat. Nos. 2,730,456 and 2,800,457 to Green et al) including gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), melamine-formaldehyde resin and hydroxypropyl cellulose, ureaformaldehyde wall-formers and more particularly Urea-resorcinol-formaldehyde wall forms (in which oleophilicity is enhanced by the addition of resorcinal) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Microencapsulation has been accomplished by a variety of known techniques including coacervation, interfacial polymerization, polymerization of one or more monomers in an oil, as well as various melting, dispersing and cooling methods.

The capsule forming material used in a given imaging system is selected based on the photosensitive composition present in the encapsulate. Thus, the formed capsule wall must be transmissive to the exposure radiation. Of the above systems urea-resorcinol-formaldehyde and gelatin capsules are preferred.

The mean size of the capsules used in the present invention may vary over a broad range but generally ranges from approximately 1 to 25 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 3 to 15 microns and particularly approximately 3 to 10 microns.

In a preferred embodiment of the invention, the imaging system is a sealed self-contained imaging system. This sealed format is advantageous because it prevents the developer material and the chemicals in the microcapsules from contacting persons during handling and, depending on the nature of the supports, it also may prevent oxygen from permeating into the photohardenable material which may improve film speed and the stability of the image. The term "sealed" as used herein refers to a seal which is designed as a nontemporary seal which results in destruction of the imaging assembly if the seal is broken.

The peripheral edges of the self-contained assembly may be sealed additionally by any of the conventional means used to seal polymeric materials such as polyethylene terephthalate. For example, the edges of the films can be heat sealed together or they can be sealed by any other technique. In one embodiment, the PET is sealed using a heat sealing method such as a heat knife.

In the imaging assembly of the invention, the previously mentioned first support is transparent and the second support may be transparent or opaque. In the latter case, an image is provided against a white background as viewed through the transparent support and in the former case a transparency is provided in which the image is viewed as a transparency preferably using an overhead or slide projector. Sometimes herein the first support may be referred to as the "front" support and the second support may be referred to as the "back" support. Typically, the first transparent support is a polyethylene terephthalate (PET) film and the second support is typically a polyethylene terephthalate film containing an opacifying agent such as a white pigment. Such supports are known in the art.

In order to insure that the imaging system is effectively sealed between the supports, a subbing layer is provided between one of the supports and the imaging layer and an adhesive is provided between the other support and the imaging layer. For optical clarity, the subbing layer will typically be located between the first support and the imaging layer. However, which support receives the subbing layer and which support receives the adhesive is a function of which support is coated with the wet imaging layer composition and which is assembled with the coated and dried imaging layer. The support which is coated with the imaging layer composition (which is typically the front support) will be provided with the subbing layer and the support which is assembled will receive the adhesive. In accordance with the preferred embodiment of the invention, the subbing layer is formed from a compound having chemical moieties such as hydroxy groups which will react with and bind to the microcapsules.

One technique which is useful to improve media stability resides in conditioning the developer and microcapsule layer at a relative humidity of about 10 to 40% and preferably, about 20%. Most preferably, the layer is conditioned at about 20% R.H., for about 2 to 12 hours or more at ambient temperatures. Sealing of the assembly at low R.H. levels after conditioning assures that the layer is relatively moisture-free during the normal shelf-life of the assembly and this reduces the tendency for the developer layer and the microcapsule layer to remain in contact after development resulting in image darkening as described above.

Adhesive materials useful in the present invention can be selected from the general class of "modified acrylics" which have good adhesion, and which may be formulated with improved "tack" by addition of tackifying resins or other chemical additives. A useful adhesive must be designed for high initial adhesion and for adhesion to plastic substrates like polyester. It must have the ability to flow quickly for laminating to porous material (the imaging layer) and yet have inertness to the imaging layer. High strength adhesives specifically found useful in this invention are the film label stock adhesives of the 3M Company; preferred are 3M's #300 and #310 adhesive formulas which have shown good "inertness" to the imaging layer and its stability, and are useful when applied in the amount of about 0.5 to 2.0 $g/m^2$.

Other examples of adhesives useful in this invention may be aqueous-based adhesives such as Aerosett 2177 or Aerosett 2550 both of which are commercially available from Ashland Chemical Co., PD 0681, AP 6903, and W 3320 available from H. B. Fuller, or solvent-based adhesives such as PS 508 sold by Ashland Chemical Co. The adhesives may be used separately or in combination. Preferably, the adhesive is transparent or translucent and most preferably it is a transparent adhesive which remains clear even after subjecting the assembly to radiation and pressure necessary to image-wise expose and rupture the microcapsules. The amount of the adhesive will vary depending on the nature of the adhesive and the support. The adhesive is generally applied in an amount of about 0.5 to 20 $g/m^2$.

EXAMPLE

Photosensitive materials were prepared using three photosensitive cylith systems containing an internal oil phase which, typically, comprises TMPTA/DPHPA monomers, antioxidant, leuco dye, DIDMA, photoinitiators, dye borate compound, disulfide and isocyanate. The three cylith systems (cyan, magenta and yellow) were separately made according to the standard Cycolor process. The amounts of materials used in the coating compositions are shown in Table 1.

TABLE 1

| Coating | Wt.(g) |
|---|---|
| Cylith | 28.20% |
| Developer resin | 65.87% |
| Other additives | 5.93% |

The other additives include crosslinking material, dispersant, etc. As a control, conventional melamine-formaldehyde microcapsules containing a photosensitive internal phase were coated onto a substrate along with a developer resin, and other additives, e.g., crosslinking material, dispersant, etc. Two samples (Sample No. 1 and Sample No. 2) were prepared and coated onto separate substrates in which the coatings were modified to contain, respectively, 1.51% and 2.97% of AQ55.

The photosensitive materials were stored under different temperatures and humidity conditions and exposed and developed in a conventional manner. H&D curves for cyan, magenta and yellow cyliths were prepared and the photographic properties shown, respectively, in Tables 2, 3 and 4.

TABLE 2

(Cyan)

| | Run | 1 | 2 | 3 | | Difference | |
|---|---|---|---|---|---|---|---|
| | Temp. (° C.) | 21 | 21 | 60 | | | |
| | R.H. (%) | 45 | 20 | | 1 vs. 2 | 1 vs. 3 | 2 vs. 3 |
| | | | Control | | | | |
| $D_{max}$ | | 1.66 | 1.75 | 1.65 | 0.09 | −0.01 | −0.10 |
| $D_{min}$ | | 0.11 | 0.12 | 0.13 | 0.01 | 0.02 | 0.01 |
| $D_{90}$ | | 2.68 | 2.82 | 2.81 | 0.14 | 0.13 | −0.01 |
| $D_{50}$ | | 3.00 | 3.22 | 3.05 | 0.22 | 0.05 | −0.17 |
| $D_{10}$ | | 3.36 | 3.63 | 3.41 | 0.27 | 0.05 | −0.22 |
| | | | Sample 1 (1.51% AQ55) | | | | |
| $D_{max}$ | | 1.74 | 1.84 | 1.69 | 0.10 | −0.05 | −0.15 |
| $D_{min}$ | | 0.11 | 0.12 | 0.113 | 0.01 | 0.02 | 0.01 |
| $D_{90}$ | | 2.80 | 2.83 | 2.82 | 0.03 | 0.02 | −0.01 |
| $D_{50}$ | | 3.10 | 3.24 | 3.05 | 0.14 | −0.05 | −0.19 |
| $D_{10}$ | | 3.46 | 3.67 | 3.40 | 0.21 | −0.06 | −0.27 |
| | | | Sample 2 (2.97% AQ55) | | | | |
| $D_{max}$ | | 1.71 | 1.80 | 1.70 | 0.09 | −0.01 | −0.10 |
| $D_{min}$ | | 0.11 | 0.12 | 0.13 | 0.01 | 0.02 | 0.01 |
| $D_{90}$ | | 2.80 | 2.83 | 2.83 | 0.03 | 0.03 | 0.00 |
| $D_{50}$ | | 3.09 | 3.29 | 3.07 | 0.20 | −0.02 | −0.22 |
| $D_{10}$ | | 3.40 | 3.69 | 3.43 | 0.29 | 0.03 | −0.26 |

TABLE 3

(Magenta)

| | Run | 1 | 2 | 3 | | Difference | |
|---|---|---|---|---|---|---|---|
| | Temp. (° C.) | 21 | 21 | 60 | | | |
| | R.H. (%) | 45 | 20 | | 1 vs. 2 | 1 vs. 3 | 2 vs. 3 |
| | | | Control | | | | |
| $D_{max}$ | | 1.68 | 1.76 | 1.70 | 0.08 | 0.02 | −0.06 |
| $D_{min}$ | | 0.13 | 0.15 | 0.16 | 0.02 | 0.03 | 0.01 |
| $D_{90}$ | | 2.68 | 2.79 | 2.82 | 0.11 | 0.14 | 0.03 |
| $D_{50}$ | | 2.91 | 3.09 | 3.02 | 0.18 | 0.11 | −0.07 |
| $D_{10}$ | | 3.30 | 3.50 | 3.36 | 0.20 | 0.06 | −0.14 |
| | | | Sample 1 (1.5% AQ) | | | | |
| $D_{max}$ | | 1.75 | 1.85 | 1.75 | 0.10 | 0.00 | −0.10 |
| $D_{min}$ | | 0.14 | 0.15 | 0.16 | 0.01 | 0.02 | 0.01 |
| $D_{90}$ | | 2.79 | 2.79 | 2.83 | 0.00 | 0.04 | 0.04 |
| $D_{50}$ | | 3.02 | 3.13 | 3.02 | 0.11 | 0.00 | −0.11 |
| $D_{10}$ | | 3.38 | 3.51 | 3.36 | 0.13 | −0.02 | −0.15 |
| | | | Sample 2 (2.97% AQ) | | | | |
| $D_{max}$ | | 1.74 | 1.80 | 1.75 | 0.06 | 0.01 | −0.05 |
| $D_{min}$ | | 0.13 | 0.15 | 0.16 | 0.02 | 0.03 | 0.01 |
| $D_{90}$ | | 2.79 | 2.80 | 2.83 | 0.01 | 0.04 | 0.03 |
| $D_{50}$ | | 3.01 | 3.15 | 3.04 | 0.14 | 0.03 | −0.11 |
| $D_{10}$ | | 3.32 | 3.52 | 3.37 | 0.20 | 0.05 | −0.15 |

TABLE 4

(Yellow)

| | Run | 1 | 2 | 3 | | Difference | |
|---|---|---|---|---|---|---|---|
| | Temp. (° C.) | 21 | 21 | 60 | | | |
| | R.H. (%) | 45 | 20 | | 1 vs. 2 | 1 vs. 2 | 2 vs. 3 |
| | | | Control | | | | |
| $D_{max}$ | | 1.40 | 1.51 | 1.42 | 0.11 | 0.02 | −0.09 |
| $D_{min}$ | | 0.18 | 0.19 | 0.20 | 0.01 | 0.02 | 0.01 |
| $D_{90}$ | | 2.83 | 2.93 | 2.95 | 0.10 | 0.12 | 0.02 |
| $D_{50}$ | | 3.35 | 3.45 | 3.51 | 0.10 | 0.16 | 0.06 |
| $D_{10}$ | | 3.63 | 3.88 | 3.72 | 0.25 | 0.09 | −0.16 |
| | | | Sample 1 (1.5% AQ) | | | | |
| $D_{max}$ | | 1.46 | 1.58 | 1.47 | 0.12 | 0.01 | −0.11 |
| $D_{min}$ | | 0.18 | 0.19 | 0.20 | 0.01 | 0.02 | 0.01 |
| $D_{90}$ | | 2.97 | 2.96 | 2.94 | −0.01 | −0.03 | −0.02 |
| $D_{50}$ | | 3.45 | 3.44 | 3.51 | −0.01 | 0.06 | 0.07 |
| $D_{10}$ | | 3.72 | 3.91 | 3.73 | 0.19 | 0.01 | −0.18 |
| | | | Sample 2 (2.97% AQ) | | | | |
| $D_{max}$ | | 1.44 | 1.56 | 1.49 | 0.12 | 0.05 | −0.07 |
| $D_{min}$ | | 0.18 | 0.19 | 0.20 | 0.01 | 0.02 | 0.01 |
| $D_{90}$ | | 2.99 | 2.94 | 2.93 | −0.05 | −0.06 | −0.01 |
| $D_{50}$ | | 3.45 | 3.44 | 3.51 | −0.01 | 0.06 | 0.07 |
| $D_{10}$ | | 3.67 | 3.92 | 3.73 | 0.25 | 0.06 | −0.19 |

The following observations on the performance of photosensitive media using AQ55 as an additive in the cooling composition of the media on a substrate are summarized as follows:

Low Humidity 21/20 RH (1) At low humidity (21/20) the Cyan system shows the most change.

(2) In all the three systems (CMY), the Toe Sensitivity is affected the most. Cyan has the largest D_10 shift of 0.27, followed by Yellow, 0.25, then Magenta, 0.20.

(3) The D_90 and D_50 of yellow are affected the least, followed by Magenta then Cyan with the largest shifts of 0.14 and 0.22 respectively.

(4) With 1 part AQ55, D_90 change for Cyan is only 0.03, more than 1 step improvement, D_50 change is 0.14, also almost 1 step improvement. The D_10 shift has only ½ step improvement.

(5) Increasing the amount of AQ55, 2 parts has no advantage at low humidity, except for higher Dmax.

High Temperature, 60° C.

(1) At 60° C., Magenta and Yellow are most affected.

(2) All three systems show a loss of sensitivity at high temperature.

(3) With 1 part AQ55, the overall change is very minimized. And toe becomes slightly faster (½ step max). Max change in D_90 is 0.04 as compared to 0.15 of control, D_50 max change is 0.06 as compared to 0.16 of control.

(4) Drop in Dmax with temperature is very much minimized with AQ55 additive.

Having described the invention in detail and by reference to preferred embodiments thereof, it will be apparent that modifications and variations are possible without departing from the scope of the invention defined in the appended claims.

What is claimed is:

1. A photosensitive material including a support having a layer of photosensitive microcapsules on the surface thereof, said photosensitive microcapsules including an internal phase containing a solution comprising a photosensitive composition and a color precursor wherein, upon image-wise exposing said photosensitive material and rupturing said microcapsules, said color precursor is image-wise released from the microcapsules to form a color image, said internal phase including a hygroscopic polymer in an amount sufficient to reduce the tendency of said color image to darken, provided said hygroscopic polymer is not polyvinyl alcohol.

2. The photosensitive material of claim 1 wherein said material further includes a layer of developer material.

3. The photosensitive material of claim 1 wherein said material comprises a first transparent support and a second support which may be transparent or opaque.

4. The photosensitive material of claim 3 wherein said first transparent support and said second support are sealed along their peripheral edges.

5. The photosensitive material of claim 3 wherein said material system further includes a subbing layer between said first transparent support and said layer of photosensitive microcapsules.

6. The photosensitive material of claim 3 wherein said material system further includes an adhesive between said layer of photosensitive microcapsules and said second support.

7. The photosensitive material of claim 1 wherein said hygroscopic polymer is selected from the group consisting of partially hydrolyzed acrylates, partially hydrolyzed methacrylates, sulfonated polyesters of aromatic dicarboxylic acids and aliphatic or cycloaliphatic glycols or alkali metal salts thereof, polyvinylpyrrolidone, polyvinyl imidozol, polyacrylamides, polymethacrylamides, polystyrenesulfonic acid, corn starch, wheat starch, agar, xanthan gums, gelatin, gelatin derivatives, cellulose, and dextrin.

8. The photosensitive material of claim 7 wherein said hygroscopic polymer is a sulfonated polyester of aromatic dicarboxylic acids and aliphatic or cycloaliphatic glycols or an alkali metal salt thereof.

9. The photosensitive material of claim 1 wherein said hygroscopic polymer is present in said internal phase in an amount of about 0.05 to 2.5% by weight of the photosensitive composition.

10. The photosensitive material of claim 3 wherein said first transparent support is a clear polyethylene terephthalate film and said second support is an opaque polyethylene terephthalate film containing a white pigment.

11. A sealed, self-contained photosensitive material comprising first and second interfacing supports, said first support carrying a layer of photosensitive microcapsules, said microcapsules containing an internal phase which includes a solution comprising a photosensitive composition and a color precursor, and a developer material present on said first support carrying said layer of photosensitive microcapsules or on said second support wherein, upon image-wise exposing said layer of photosensitive microcapsules and rupturing said microcapsules, the color precursor is released from said microcapsules and reacts with said developer material to form a color image, wherein said internal phase contains a hygroscopic polymer in an amount sufficient to reduce the tendency of said color image to darken, provided said hygroscopic polymer is not polyvinyl alcohol.

12. The self-contained photosensitive material of claim 11 wherein said hygroscopic polymer is present in said internal phase in an amount of about 0.05 to 2.5% by weight of said photosensitive material.

13. The photosensitive material of claim 10 wherein said supports are sealed at their perimeter.

* * * * *